United States Patent [19]

Miner

[11] 3,797,322

[45] Mar. 19, 1974

[54] FINE TUNING MEANS FOR STEP-BY-STEP TV TUNER

[75] Inventor: Carroll R. Miner, Wilbraham, Mass.

[73] Assignee: General Instrument Corporation, Newark, N.J.

[22] Filed: Jan. 23, 1973

[21] Appl. No.: 326,146

[52] U.S. Cl. ................................ 74/10.54, 74/10.8
[51] Int. Cl. ............................ H03j 1/08, H03j 1/14
[58] Field of Search .......................... 74/10.54, 10.8

[56] References Cited

UNITED STATES PATENTS 3,618,405 11/1971 Ishida ................................ 74/10.54

*Primary Examiner*—Allan D. Herrmann

[57] ABSTRACT

In a tuner for tuning a TV set or the like to a selected one of a plurality of predetermined frequencies or channels, means are provided for fine tuning of the set at a given channel setting, which fine tuning arrangement, although positive in operation and effective to maintain its position as the set is turned from one channel to the next, takes up a minimal amount of space. One of the members which rotates when the channel selection is effected carries a part which is pivotally mounted thereon, and a cam controlled by the fine tuning shaft rotates about an axis displaced from the axis of the member to position that part, which is in turn connected to the output element which drives the tuning device itself thus addition an increment of movement in one direction or the other to the gross meovement produced when the member is moved to effect channel selection.

22 Claims, 5 Drawing Figures

FINE TUNING MEANS FOR STEP-BY-STEP TV TUNER

The present invention relates to a tuning mechanism particularly well adapted for tuning to a selected one of a plurality of TV channels and then providing for fine tuning within the channel.

Tuners designed when actuated to tune a receiving set such as a television receiver to a preselected one of a plurality of stations or channels are well known and take many forms. Insofar as the present invention is concerned, the precise nature of the means employed in the communications receiver itself to effect tuning to a particular reception frequency forms no part of the present invention. What this invention is directed to is the mechanism by means of which a tuning element, whatever its character, is appropriately conditioned for precise reception of a particular station or channel. The invention is here specifically disclosed in connection with a tuner designed to effect tuning over the entire UHF band, in which there are seventy or more individual channels. To provide a device capable of coarse tuning to any selected one of the seventy or more available UHF channels with sufficient accuracy so as to be capable of distinguishing in its tuning between any two adjacent channels presents many problems, both mechanical and electrical. The public has become accustomed to step-by-step TV tuning in connection with the thirteen available channels in the VHF band, and therefore expects similar tuning capability in the UHF band, but the much greater number of channels which must be tuned in the UHF band, and the very high precision of tuning which is required because of the relatively close spacing of those channels, has given rise to special new mechanical arrangements for UHF TV tuners.

With UHF tuning, as with VHF tuning, some means must be provided so that the user, once a particular channel have been selected, can fine-tune the set for optimum reception. Many different arrangements have been proposed in the past for superimposing fine tuning on coarse tuning, but the special requirements which a fine tuning arrangement must have, particularly in a seventy-channel UHF tuner, has rendered prior approaches to the problem objectionable in one respect or another. Among the considerations which must be taken into account in designing a fine tuning arrangement in connection with a step-by-step tuner are the following:

The fine tuning must not inhibit each of coarse tuning. The fine tuning, when once adjusted for a particular station, should remain in its adjusted position as the tuner is shifted from channel to channel, thus minimizing the likelihood that fine tuning will be required for all channels. The fine tuning must be sufficiently sensitive so as accurately to accomplish its designed purpose, but it must be sufficiently insensitive insofar as manipulation is concerned so that it can be manipulated effectively even by an unskilled user. It must not add appreciably to the cost of the tuner, since set manufacturers, who as a generale rule purchase tuners from tuner manufacturers, are exceedingly cost conscious, particularly in view of the very high volume production which is involved, by reason of which the saving of a few cents on a tuner, when multiplied by the number of sets made, represents a very substantial overall savings. The fine tuning mechanism must not take up much space, and the additional space that it requires should be minimized as much as possible, since a very large proportion of the TV sets sold are of the compact or semi-compact type, and since in general the UHF tuner will merely be an accessory or adjunct to a basic VHF receiver.

It is the prime object of the present invention to devise a TV tuner provided with coarse and fine tuning arrangements in which the fine tuning structure satisfies all the above requirements to as great a degree as possible.

It is a further object of the present invention to provide a fine tuning arrangement for a TV tuner in which the parts of the fine tuning mechanism are simple, inexpensive and need not be manufactured to any great degree of precision.

It is another object of the present invention to devise a fine tuning arrangement for a step-by-step tuner in which the fine tuning mechanism is carried by the step-by-step mechanism in a particularly facile and effective manner, thereby to minimize the amount of space which is taken up by the fine tuning mechanism and to maximize the effectiveness of the fine tuning mechanism.

In the coarse or step-by-step tuning system there is a part which is rotated by a coarse driving shaft accessible to the user. That part in turn is drivingly connected to the tuning shaft of the actual electrical tuning instrumentality. The connection between that part and the driving shaft includes a member articulately mounted on the part, that member being at one end operatively drivingly connected to the tuning shaft of the tuning instrumentality and being operatively connected at its other end to a cam rotatably mounted on the rotative part at a point radially displaced from the axis about which that part rotates. That cam in turn is adapted to be rotated by the fine tuning shaft accessible to the user, as by means of a gear arrangement carried by the part and rotating with the part. The position of the member relative to the part is controlled by the cam, the member otherwise rotating with the part. Hence rotation of the part is transmitted to the tuning shaft of the tuning instrumentality by movement of the member with the part, thus producing a coarse tuning effect, and any rotation of the cam, as produced by rotation of the fine tuning shaft, causes the member to shift its position relative to the part, thereby adding an increment of movement to the tuning shaft of the tuning instrumentality, that increment of movment producing the fine tuning effect. By frictionally mounting the cam on the part which carries it, and by appropriate mechanical connection between that cam and the fine tuning shaft, the cam will remain stationary relative to the part which carried it as that part is rotated for tuning from one channel to the next, and as a result the fine tuning adjustment will remain fixed as the tuner is manipulated to select one channel or another, but that fine tuning arrangement can readily be changed whenever reception conditions dictate.

To the accomplishment of the above, and to such other objects as may hereinafter may appear, the present invention relates to the structure and arrangement of a tuning system including fine tuning means as defined in the appended claims and as described in this specification, taken together with the accompanying drawings in which:

Figure 1:
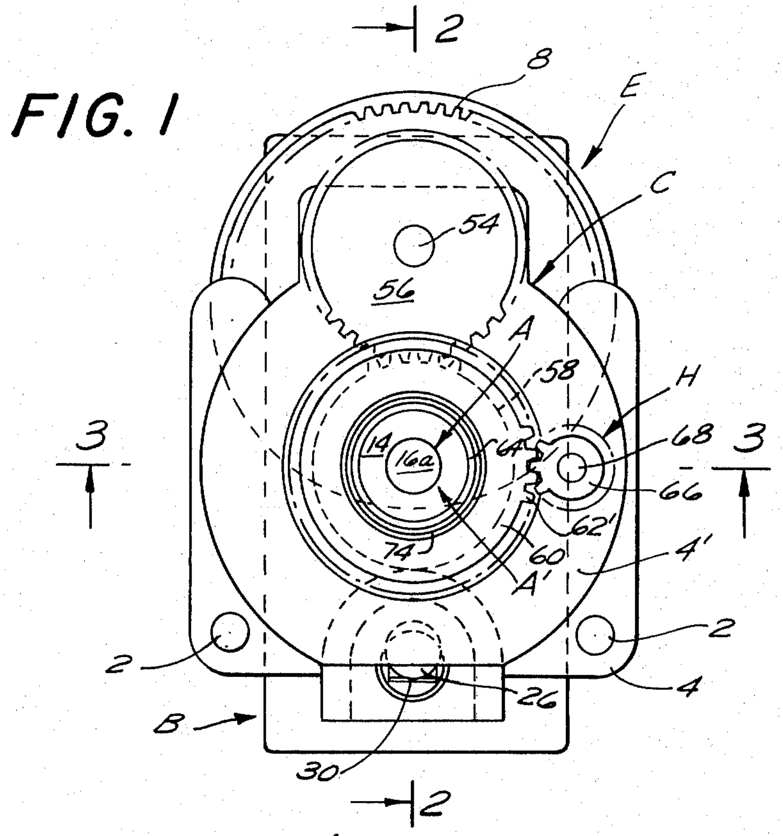
FIG. 1 is a front elevational view of an exemplary embodiment of the present invention.
Figure 3:
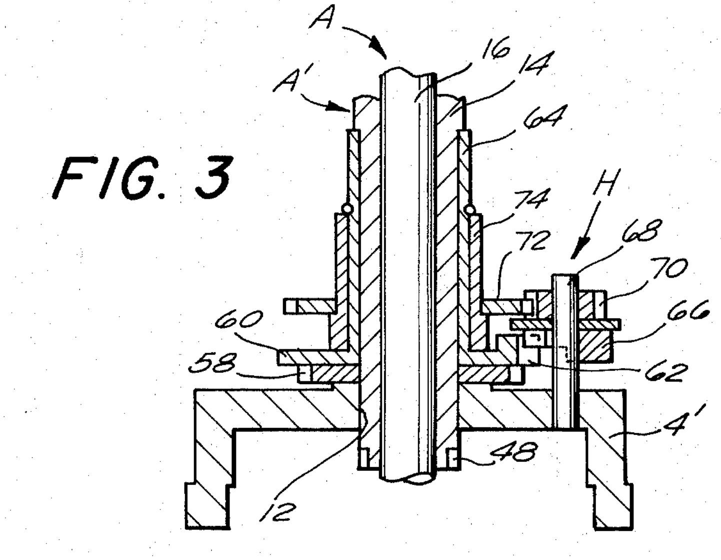
FIG. 3 is a cross-sectional view taken along the line 3—3 of FIG. 1.
Figure 2:
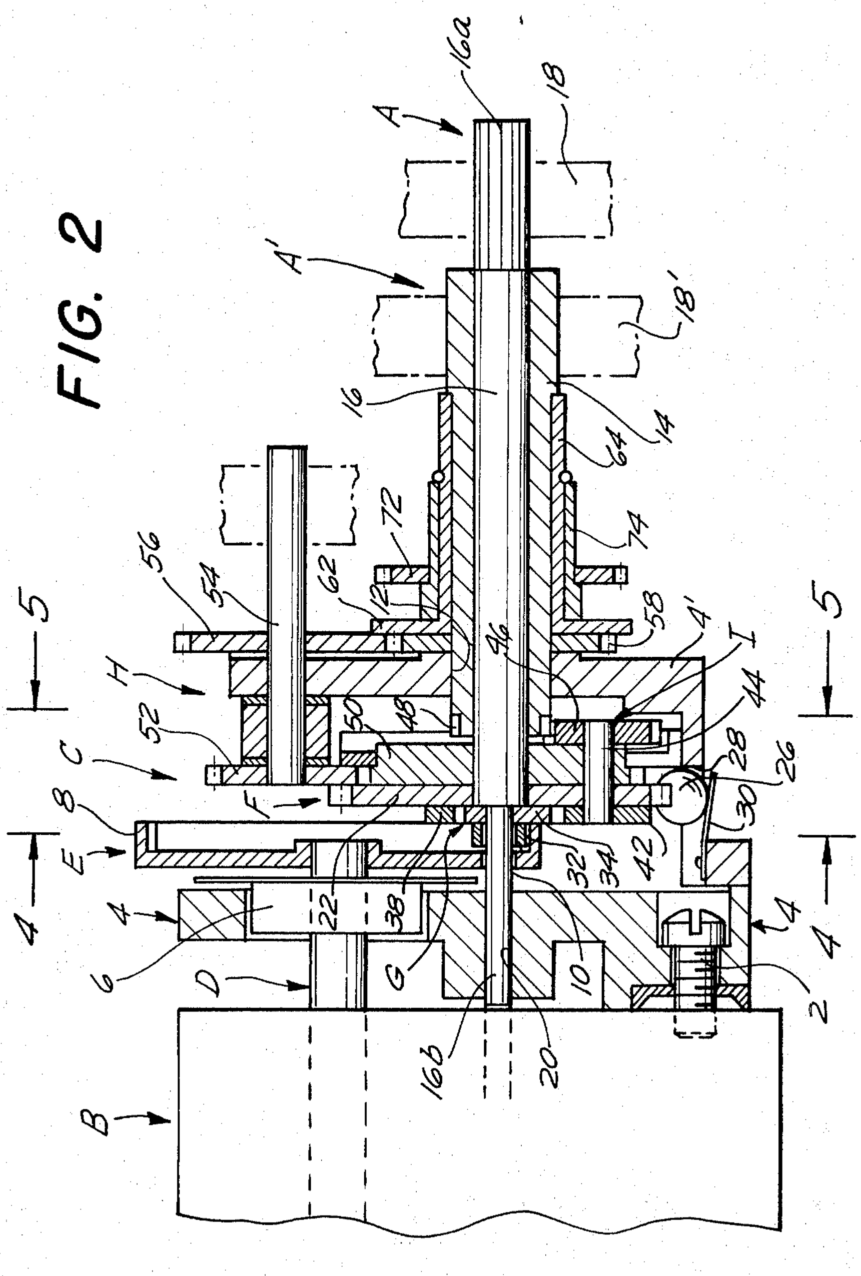
FIG. 2 is a cross-sectional view taken along the line 2—2 of FIG. 1.
Figure 4:
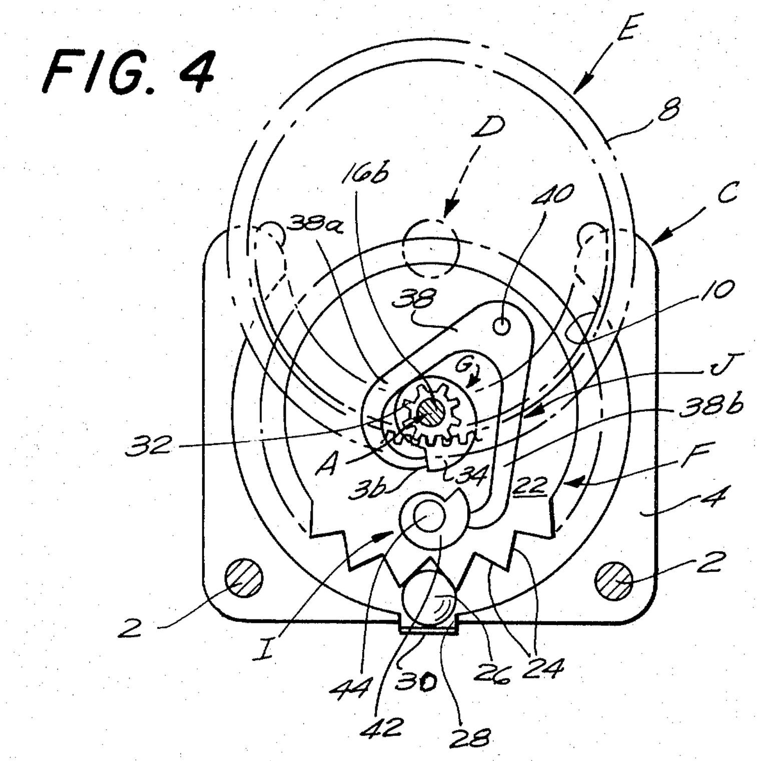
FIG. 4 is a cross-sectional view taken along the line 4—4 of FIG. 2.
Figure 5:
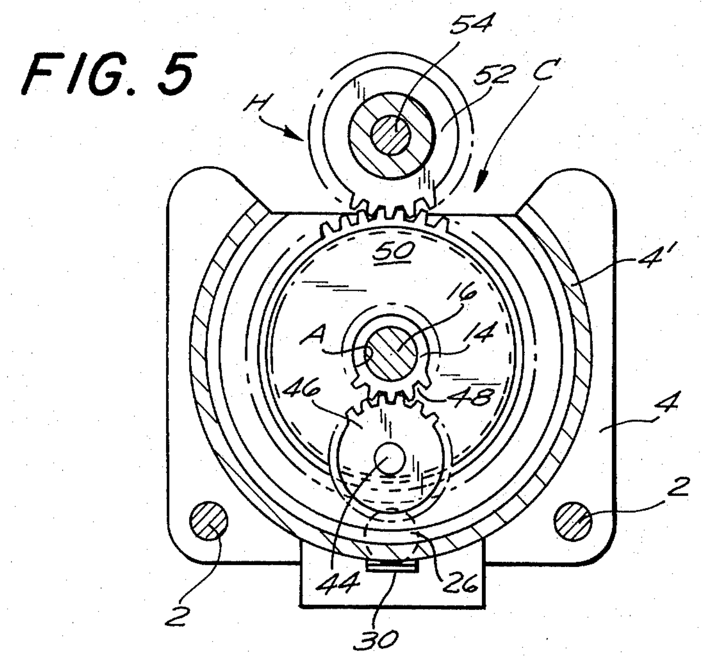
FIG. 5 is a cross-sectional view taken along the line 5—5 of FIG. 2.

Broadly considered, the tuner of the present invention comprises a coarse tuning input member generally designated A and a tuning element generally designated B, with a transmission means generally designated C operatively connected between them so that driven movement of the input member A is converted into appropriate movement and conditioning of the tuning element or instrumentality B. As here disclosed for purposes of ready illustration, the tuning element B is in the form of any suitable tuning structure, such as a variable capacitor or variable inductor, having an input control shaft generally designated D. Operating means generally designated E is connected to the input control shaft D to rotate the latter. The input member A is operatively connected to the operating means E via a first means in the form of a rotatable part generally designated F, which in turn drives a first element generally designated G operatively connected between the parts operating means E and first means F. Some suitable display means (not shown) may be provided to indicate the channel or station to which the tuning element or instrumentality B is tuned. Driving mechanism for a digital type of display mechanism is shown, generally designated H. For fine tuning an input member generally designated A′ is provided, which is operatively connected, by transmission means generally designated I and operative connecting means generally designated J, to the first element G which in turn drives the operating means E. The operative connection J is articulately mounted on and is rotatably carried by the first element F, being mounted thereon at a point radially displaced from the axis of rotation of the first element F. As may best be seen from FIG. 2, the parts A A′, F and G may all be mounted coaxially, with the fine tuning mechanism taking up no additional axial or radial space over and above that required by the coarse tuning means.

Turning now to a more detailed description of the preferred embodiment here specifically disclosed, the tuning element or instrumentality B is secured in any appropriate manner, as by screws 2, to a mounting bracket generally designated 4, with its control shaft D being received in and extending through a bearing 6 mounted on the bracket 4. Mounted fast on the control shaft D is the output member E of the transmission means C, here shown in the form of an internal gear 8 provided with an arcuate slot 10 the arcuate extent of which corresponds to the degree to which the internal gear 8 must be rotated ( usually 180° or somewhat less). A central supporting element 4′ is mounted on the bracket 2 and extends out therefrom to the right as viewed in FIG. 2. It is provided with a central aperture 12 within which a hollow shaft 14 is rotatably mounted, the hollow shaft 14 constituting the input A′ for the fine tuning system. Freely rotatably mounted within the shaft 14 is shaft 16, the shaft 16 constituting the input member A for the coarse tuning system. The shaft 16 extends out to the right beyond the shaft 14, at **16*a*, and an actuating knob 18 (shown in broken lines) is adapted to be secured thereto. A fine tuning actuating knob 18′ is adapted to be secured to the exposed portion of the fine tuning shaft 14. The left hand end of the shaft 16, designated 16*b*, extends through the slot 10 of gear 8 and is journaled in opening 20 formed in the mounting bracket 4. Thus the two shafts 14 and 16** are rotatably mounted in the tuner.

Fast on shaft 16, between the central supporting element 4′ and the bracket 4, is the rotated first means F here shown as a detent wheel 22 having in its outer periphery a series of detent notches or recesses 24 which cooperate in well known detent fashion with a detent ball 26 received within recess 28 in the bracket 4 and resiliently urged into engagement with the recesses 24 on the detent wheel 22 by means of leaf spring 30. The first element G is freely rotatably mounted on the reduced-diameter portion **16*b* of the shaft 16, and comprises a pinion section 32 received inside the ring gear 8 and meshing with its internal gear surface, and a section 34 to the right of the section 32 wich carries an abutment surface 36. The driving interconnection between the detent wheel 22 and the section 34 of the first element G is accomplished by means of the member J, here shown in the form of a lever 38 pivotally mounted on the detent wheel 22 at a point 40 radially displaced from the axis of rotation of the detent wheel 22. The lever 38 is provided with a pair of arms 38*a* and 38*b*. The arm 38a is adapted to engage the abutment surface 36 of the section 34 of the first element G. The arm 38b engages a rotary cam 42 also mounted on the detent wheel 22, fast on shaft 44 which passes through that detent wheel and carries at its other end the gear 46, which in turn meshes with pinion teeth 48 on the fine tuning shaft 14. Any suitable means, such as tight fit, friction surfaces, spring loading or the like, may be provided to tend to retain the cam 42, shaft 44 or gear 46 in fixed rotated position on the detent wheel 22, that frictional retention being insufficient, however, to prevent manual rotation of the parts 42, 44 and 46 when the fine tuning shaft 14** is manually rotated.

Mounted fast on the shaft 26, and therefore rotatable with it and with the detent wheel 22, is a gear 50 which meshes with gear 52 fast on shaft 54 carried rotatably at the upper end of the central supporting element 4′. The shaft 54 in turn rotates gear 56, which meshes with gear 58 freely rotatably mounted on the shaft 14. The gear 58 in turn rotates a gear 60 having interrupted teeth 62, and it also rotates a sleeve 64 which extends out to the right and is adapted to carry the "units" part of a suitable digital indicator. The interrupted teeth 62 mesh with a gear 66 carried on shaft 68 extending out from the central supporting element 4′, the gear 66 causing rotation of gear 70, which in turn meshes with gear 72 fast on sleeve 74 freely rotatably mounted on sleeve 64. The sleeve 74 is adapted to carry the "tens" indicator of a suitable digital indicating means.

In the tuning device embodiment here specifically illustrated, the transmission ratio between the pinion 32 and the internal ring gear 8 is such that approximately a 7-1 speed reduction is effected, so that for 180° of rotation of the ring gear 8 and hence of the input control shaft D of the tuning instrumentality B, the coarse tuning shaft 14 and the detent wheel 22 which is fast thereon will have to make approximately 3 ½ revolutions. If seventy discrete tuning positons are to be provided corresponding to the seventy available UHF channels, only twenty notches or recesses 24 need be provided in the outer periphery of the detent wheel 22. When the corase tuning or channel selector knob 18 is rotated, the shaft 16 rotates with it and the detent wheel 22 rotates with both of them. As the detent wheel 22 rotates a member in the form of lever 38 is carried along with it, the ends of its arms 38*a* and 38*b* being rigidly engaged between the outer surface of the cam 42 and the abutment surface 36 of the section 34 of the part 32. In order to insure engagement between the abutment surface 36 and the end of the arm 38*a*, appropriate spring loading is applied to the ring gear 8, that spring loading working back through the section 32 of the first element G. Hence as the lever 38 is rotated along with the detent wheel 22, a corresponding degree of rotation will be imparted to the first element G, its pinion section 32 will rotate while in engagement with the internal gear surface of the ring gear 8, the ring gear 8 will be rotated, and hence the input control shaft D of the tuning instrumentality B will be rotated, effecting the desired tuning. At the same time that the detent wheel 22 rotates the gear 50 rotates, driving the gear 56 via the gear 52, and this in turn causes rotation of the sleeve 64 in a step-wise fashion, shifting the "units" indicator of the display device. By means of the gears 62, 66, 70 and 72 the sleeve 74 is intermittently shifted rotatably, thus causing a change in the "tens" indicator of the display device when that is appropriate, so that the display device will at all times indicate the particular channel to which the set is tuned. It will be understood, of course, that any other desired type of display device could be employed with this tuner, the specific nature and construction of the display device forming no part of the present invention.

When the detent wheel 22 rotates, the cam means 42, the shaft 44 and the gear 46 will be carried around with it. The frictional engagement between those parts, or any one of them, and the detent wheel 22, will ensure that the cam 42 will remain in a given position as the detent wheel 22 is rotated, thus ensuring that the end of the arm 38*b* of lever 38 will remain in the same position relative to the detent wheel 22, and as a result the lever 28 will not shift its position relative to the detent wheel 22. It is preferred that the gear arrangement between the gears 46 and 48 be such that, as the gear 46 is thus moved around the fine tuning shaft 14, the fine tuning shaft 14 will not be rotated, but this type of operation is not essential. Indeed, in some instances it might be desired that the fine tuning shaft 14 rotate with the coarse or channel selector shaft 16 so that the relationship between the fine and coarse tuning knobs 18' and 18 respectively will remain the same, thus enabling an indication of fine tuning adjustment to be given by the relative rotational relationships of the knobs 18 and 18' respectively. This, too, can be accomplished by suitable design of the gears 46 and 48.

After a given channel has been selected, and if it is desired to effect a slight change in the tuning so that optimum reception will result, the operator will rotate the fine tuning knob 18' which in turn will rotate the fine tuning shaft 14 while the coarse tuning shaft 16 remains stationary. As a result the gear 48 will turn the gear 46, and that will turn the cam 42. As the cam 42 turns the end of the lever arm 38*b*, pressed against it by the spring loading on the ring gear 8 which has been fed back to it via the first element G and the lever arm 38*a*, will move to stay in engagement with the cam surface of the cam 42, and this in turn will cause the lever 38 to swing about the axis 40 relative to the detent wheel 22, while that detent wheel 22 itself remains stationary. Any such movement of the lever 38 will be transmitted, by the lever arm 38*a*, to the abutment surface 36 on the section 34 of the part G, and this in turn will cause a slight but definite rotation of the section 32 thereof, thus causing a corresponding slight rotation of the ring gear 8 and of the input control shaft D or the tuning instrumentality B, thereby to effect the desired fine tuning adjustment.

By virtue of the arrangement here described, both coarse and fine tuning are accomplished in a simple and positive manner, through the use of simple and sturdy parts, and, most particularly, through the use of but a minimal number of such parts none of which need be made to any particularly high degree of precision. The manner in which the fine tuning system is structural associated with the coarse tuning system is such that virtually no additional space is taken up by the fine tuning mechanism. It is completely radially enclosed inside the coarse tuning mechanism, so that literally no additional radial space is used by the fine tuning mechanism. Considered axially, and as may best be seen in FIG. 2, all that is involved is the thickness of the cam 42 and the gear section 34 and the lever 38, but these are involved not additively but only in parallel, that is to say, a single dimensional allowance for the thickness of any one of those parts also accommodates all of the other parts. In an actual tuner the axial distance involved may be as little as 1/16 inch, and even if an allowance of twice or three times that distance is provided in a given unit, the distance involved is still virtually inconsequential.

While but a single embodiment of the present invention has been here specifically disclosed, it will be apparent that many variations may be made therein, all within the scope of the invention as defined in the following claims.

I claim:

1. In a tuner drive assembly comprising a frame, a tuning instrumentality having a control means mounted on said frame, a coarse tuning shaft, first means rotatable about an axis and operatively and drivingly connected to said coarse tuning shaft, and operating means operatively connected to said control means to move the latter, and an operative driving connection between said first means and said operating means; the improvement which comprises said operative connection comprising a first element drivingly connected to said operating means and having an engageable surface, a member carried by and movable relative to said first means, said member having first and second parts, said first part operatively drivingly engaging said engageable surface of said first element, cam means movably mounted on said first means at a point on said first means radially displaced from the axis of said first means and operatively engaged with said second part of said member, a fine tuning shaft on said frame, and an operative connection between said fine tuning shaft and said cam means.

2. The tuner drive assembly of claim 1, in which said first and operating means are mounted on said frame coaxially with one another.

3. The tuner drive assembly of claim 2, in which said member is pivotally mounted on said first means at a point radially displaced from the axis of said first means.

4. The tuner drive assembly of claim 3, in which said first means comprises a detent wheel, said frame carrying means which engages said wheel in a detenting relationship.

5. The tuner drive assembly of claim 4, in which said first element is coaxial with said first means.

6. The tuner drive assembly of claim 5, in which said operative connection between said fine tuning shaft and said cam means comprises a gear on said fine tuning shaft and a gear operatively connected to said cam means, carried by said first means, and bodily movable about said fine tuning shaft gear as said first means is rotated by said coarse tuning shaft.

7. The tuner drive assembly of claim 6, in which said cam is frictionally mounted on said first means, thereby to tend to retain its position thereon unless positively caused to shift its position relative thereto through actuation of said fine tuning shaft.

8. The tuner drive assembly of claim 2, in which said first means comprises a detent wheel, said frame carrying means which engages said wheel in a detenting relationship.

9. The tuner drive assembly of claim 2, in which said first element is coaxial with said first means.

10. The tuner drive assembly of claim 2, in which said operative connection between said fine tuning shaft aand said cam means comprises a gear on said fine tuning shaft and a gear operatively connected to said cam means, carried by said first means, and bodily movable about said fine tuning shaft gear as said first means is rotated by said coarse tuning shaft.

11. The tuner drive assembly of claim 10, in which said cam is frictionally mounted on said first means, thereby to tend to retain its position thereon unless positively caused to shift its position relative thereto through actuation of said fine tuning shaft.

12. The tuner drive assembly of claim 1, in which said member is pivotally mounted on said first means at a point radially displaced from the axis of said first means.

13. The tuner drive assembly of claim 12, in which said first means comprises a detent wheel, said frame carrying means which engages said wheel in a detenting relationship.

14. The tuner drive assemby of claim 12, in which said first element is coaxial with said first means.

15. The tuner drive assembly of claim 12, in which said operative connection between said fine tuning shaft and said cam means comprises a gear on said fine tuning shaft and a gear operatively connected to said cam means, carried by said first means, and bodily movable about said fine tuning shaft gear as said first means is rotated by said coarse tuning shaft.

16. The tuner drive assembly of claim 15, in which said cam is frictionally mounted on said first means, thereby to tend to retain its position thereon unless positively caused to shift its position relative thereto through actuation of said fine tuning shaft.

17. The tuner drive assembly of claim 1, in which said first means comprises a detent wheel, said frame carrying means which engages said wheel in a detenting relationship.

18. The tuner drive assembly of claim 1, in which said first element is coaxial with said first means.

19. The tuner drive assembly of claim 1, in which said operative connection between said fine tuning shaft and said cam means comprises a gear on said fine tuning shaft and a gear operatively connected to said cam means, carried by said first means, and bodily movable about said fine tuning shaft gear as said first means is rotated by said coarse tuning shaft.

20. The tuner drive assembly of claim 19, in which said cam is frictionally mounted on said first means, thereby to tend to retain its position thereon unless positively caused to shift its position relative thereto through actuation of said fine tuning shaft.

21. The tuner drive assembly of claim 17, in which said operative connection between said fine tuning shaft and said cam means comprises a gear on said fine tuning shaft and a gear operatively connected to said cam means, carried by said first means, and bodily movable about said fine tuning shaft gear as said first means is rotated by said coarse tuning shaft.

22. The tuner drive assembly of claim 21, in which said cam is frictionally mounted on said first means, thereby to tend to retain its position thereon unless positively caused to shift its position relative thereto through actuation of said fine tunig shaft.

* * * * *